US005470244A

United States Patent [19]
Lim et al.

[11] Patent Number: 5,470,244
[45] Date of Patent: Nov. 28, 1995

[54] ELECTRICAL CONNECTOR HAVING REDUCED CROSS-TALK

[75] Inventors: Gunsang Lim, Cordova; Richard D. Marowsky, Collierville, both of Tenn.; Ben Khoshnood, Parkland, Fla.

[73] Assignee: Thomas & Betts Corporation, Memphis, Tenn.

[21] Appl. No.: 132,015

[22] Filed: Oct. 5, 1993

[51] Int. Cl.$^6$ .................................................. H01R 21/22
[52] U.S. Cl. ...................... 439/189; 439/941; 29/402.08
[58] Field of Search .................... 439/607–610, 439/676, 638, 620, 189, 49; 333/1, 12; 379/332, 417; 29/846, 402.01, 402.03, 402.08

[56] References Cited

U.S. PATENT DOCUMENTS

| | | | |
|---|---|---|---|
| 2,667,543 | 1/1954 | Smith et al. | 174/33 |
| 3,757,028 | 9/1973 | Schlessel | 174/34 |
| 4,157,612 | 6/1979 | Rainal | 174/32 |
| 4,418,239 | 11/1983 | Larson et al. | 174/34 |
| 4,428,632 | 1/1984 | Rich | 333/260 |
| 4,551,576 | 11/1985 | Rich | 174/36 |
| 4,657,330 | 4/1987 | Levy | 439/402 |
| 4,831,497 | 5/1989 | Webster et al. | 361/406 |
| 4,878,847 | 11/1989 | Rutledge | 439/74 |
| 5,186,647 | 2/1993 | Denkmann et al. | 439/676 |
| 5,226,835 | 7/1993 | Baker, III et al. | 439/403 |

FOREIGN PATENT DOCUMENTS

| | | |
|---|---|---|
| 0421174 | 4/1991 | European Pat. Off. . |
| 0524358 | 1/1993 | European Pat. Off. . |
| 0525703 | 2/1993 | European Pat. Off. . |
| 61-256850 | 11/1986 | Japan . |
| 2-91987 | 3/1990 | Japan . |
| 2-268484 | 11/1990 | Japan . |
| 2233157 | 1/1991 | United Kingdom . |
| 2269941 | 2/1994 | United Kingdom . |

OTHER PUBLICATIONS

IBM Technical Disclosure Bulletin, 5 pages, pp. 762–766, vol. 18, No. 3 Aug. 1975.
IBM Technical Disclosure Bulletin, 2 pages, pp. 155–156, vol. 16, No. 1 Jun. 1973.
IBM Technical Disclosure Bulletin, 2 pages, pp. 354–355, vol. 33, No. 2 Jul. 1990.
Japan Abstract, JP5136650, Jan. 6, 1993, 1 page, vol. 17, No. 518.
IBM Technical Disclosure Bulletin, 3 pages, pp. 375–377, vol. 30, No. 8 Jan. 1988.

*Primary Examiner*—Neil Abrams
*Attorney, Agent, or Firm*—Robert M. Rodrick

[57] ABSTRACT

An electrical connector (30) having crosstalk reduction between selected pairs of electrical contacts comprises a printed circuit board (36, 36') having a pair of circuit elements (40, 42) therein connected through welding pads to selected contacts (6, 3) the connector. The signal paths of such selected contacts are severed and then are re-routed by means of the pattern of circuit elements in the printed circuit board, each circuit element balancing the mutual inductance in such re-routed signal paths for enhanced crosstalk reduction.

17 Claims, 6 Drawing Sheets

ELECTRICAL CONNECTOR HAVING REDUCED CROSS-TALK

FIELD OF INVENTION

This invention relates generally to electrical connectors and, more specifically, to an electrical connector having reduced crosstalk interference.

BACKGROUND OF THE INVENTION

Efforts have recently been made to utilize conventional telephone RJ45 jack and plug connectors for data transmission having higher transmission frequencies than is required in voice transmission. The performance criteria for such jack and plug connectors is governed by the EIA/TIA standard TSB-40 (connecting hardware specification), Category 5. One aspect of the Category 5 level in the standard is a lower level of crosstalk coupling between adjacent contacts in the electrical connectors. By way of example, a standard OMNI RJ45 jack connector in commercial use by the assignee of the subject application meets Category 3 of the crosstalk requirements per the TSB-40 performance requirements.

It is known that crosstalk reduction or cancellation may be achieved in an electrical connector by adding capacitance between certain pairs of conductors or contacts within a standard OMNI jack. This is described, in particular in U.S. patent application, Ser. No. 08/011,020, entitled, "Apparatus and Method for Cross-Talk Reduction," filed on Jan. 29, 1993, and assigned to the same assignee as the subject, application now abandoned. As described and shown in such application, the particular technique for increasing the capacitance between selected connector contacts is to add discrete capacitors thereto. The application further recognizes that such increased capacitance may be obtained from distributed and/or stray capacitance which may be derived from appropriate disposition of traces on a printed circuit board which is used to connect selected pairs of contacts in the connectors described therein.

It is therefore desirable to not only achieve an electrical connector having the Category 5 crosstalk requirements, but also to decrease the cost of such connectors and improve the manufacturability thereof. It is further desirable to continue to utilize standard devices as much as possible, such as the use of a standard OMNI plug if a modified jack in connection therewith satisfactorily meets the Category 5 performance level.

SUMMARY OF THE INVENTION

It is accordingly an object of the subject invention to provide an electrical connector which achieves reduced crosstalk coupling between selected pairs of electrical contacts.

In accordance with a preferred form of the invention, an electrical connector comprises an insulative housing, a plurality of electrical contacts being supported on the housing. The contacts are disposed in a side-by-side arrangement with a spacing between each pair of contacts. A dielectric substrate overlies the contacts, a conductive trace being supported by the dielectric substrate. The conductive trace is disposed to be in spatial registry with one of the contacts in the connector. The conductive trace is of configuration to define with the dielectric constant and permeability of the dielectric substrate a predetermined mutual inductance and capacitance. A conductive element is provided which connects the conductive trace to another one of the contacts in the electrical connector.

DETAILED DESCRIPTION OF THE PREFERRED EMBODIMENTS

Figure 1:
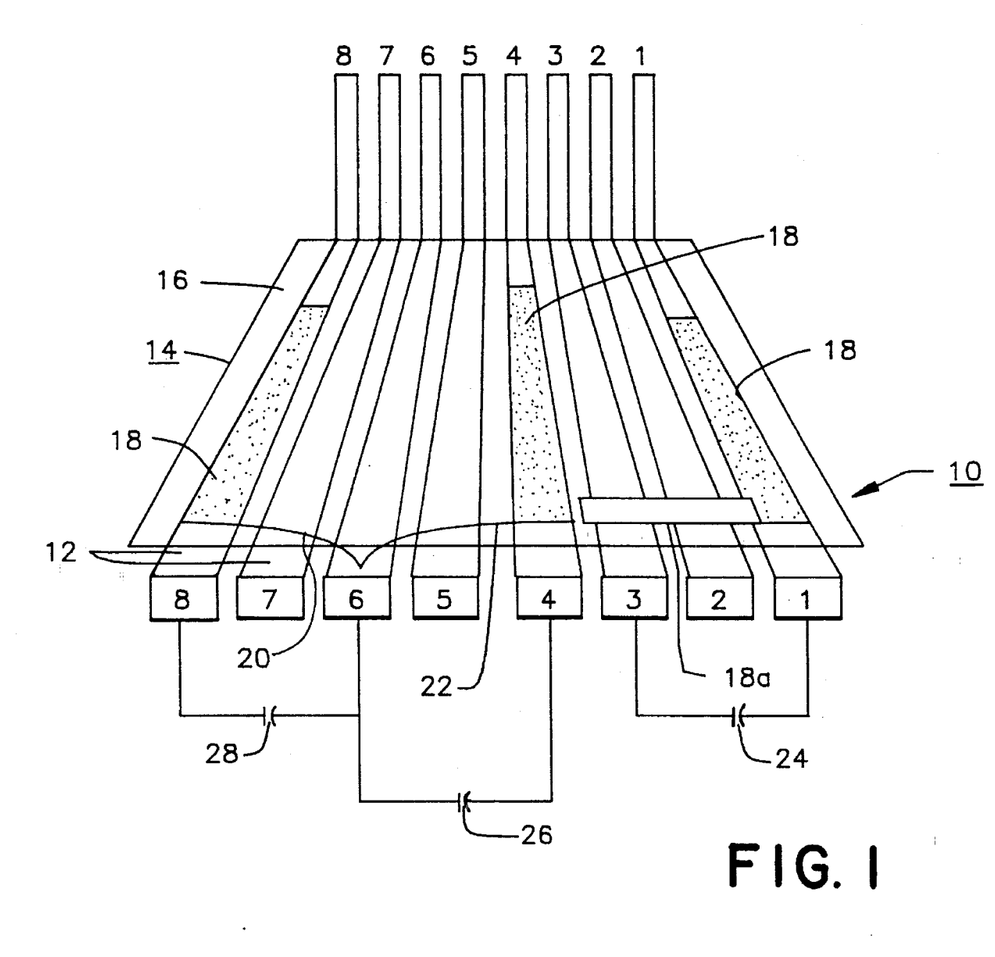
FIG. 1 is a schematic illustration of one form of the invention for use in reducing crosstalk of a multi-contact connector.

Turning now to FIG. 1, there is schematically shown one form of the invention for use in increasing the capacitance in a multi-contact electrical connector. Schematically, in the illustration shown, the electrical connector 10 comprises eight contacts 12 arranged in side-by-side disposition. Each of the contacts in the preferred configuration has a generally rectangular cross-section and a substantially flat upper surface, the upper surfaces of each of the contacts 12 generally lying in a common plane. The contacts 12 are configured to represent a standard OMNI RJ45 jack connector.

Overlying the contacts 12 is a printed circuit board 14 comprising a dielectric substrate 16, such as MICA. Traces 18 of conductive material, such as copper, are supported on the substrate 16 in spatial registry with selected connector contacts 12, such as contact No. 1, No. 4 and No. 8, as shown. The disposition of the traces 18 over the contacts 12 with dielectric material and its permeability therebetween creates a capacitive relationship between the conductive traces and the contacts that may be considered parallel plates, and effects the inductance and conductance as well. In principle, capacitance between parallel plates is basically a function of (1) the area A of the plates, (2) the distance D between the plates, and (3) the dielectric constant K of the dielectric material between the plates. Such capacitance, in picofareds (pF), may be calculated using the equation:

$$C = (0.2249 A/D) K$$

The conductive traces 18 may be connected to another connector contact 12 to increase the capacitance between contact pairs. For example, a connecting element, such as a wire 20, may be used to connect the conductive trace 18 over contact 8 to contact 6 and another wire 22 may be used to connect the conductive trace 18 over contact 4 to contact 6. Alternatively, a portion 18a may be formed from the conductive-trace 18, such connecting trace 18a being connected, for example, to contact 3. So connected, the capacitance 24 may be increased between pair 1–3, the capacitance 26 may be increased between pair 4–6 and the capacitance 28 may be increased between pair 6–8. In one example, the MICA substrate may be selected to be approximately 0.002 inch thick and the copper conductive traces selected to be 0.002 inch thick.

Figure 2:
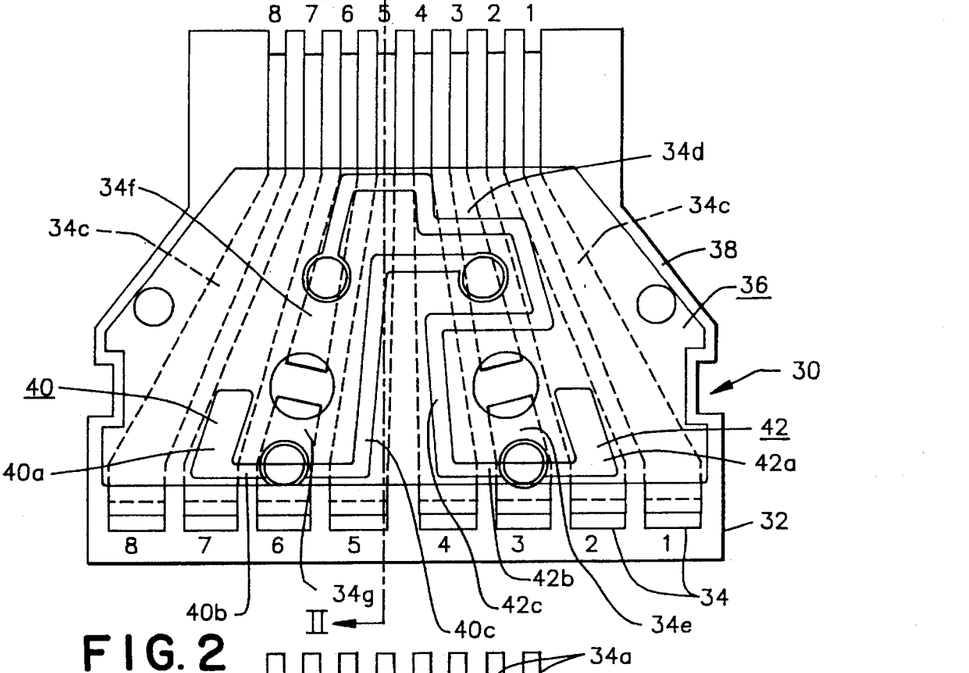
FIG. 2 is a top plan view of an OMNI jack connector comprising a printed circuit board particularly adapted to provide crosstalk reduction between selected pairs of contacts in the connector.
Figures 3, 4:
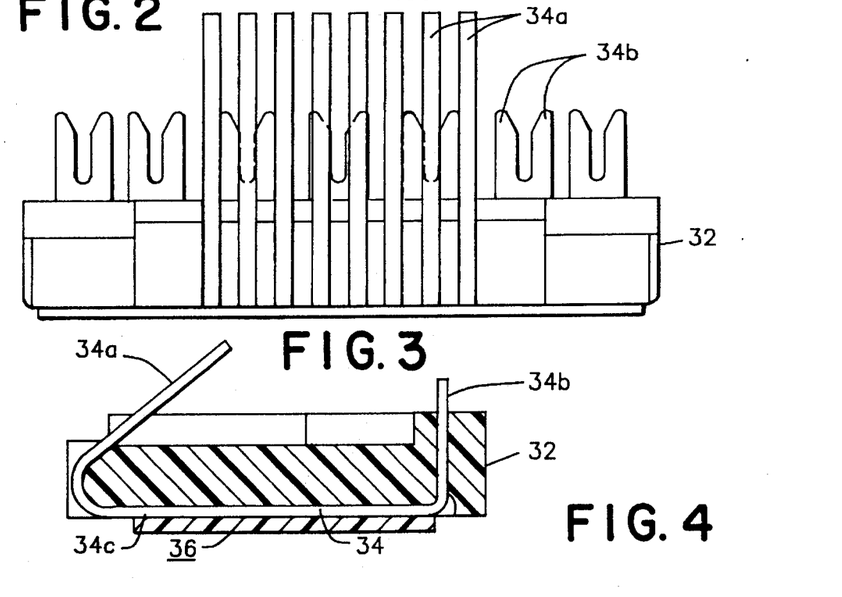
FIG. 3 is a front elevation view of the connector of FIG. 2.
FIG. 4 is a cross-sectional view of the connector of FIG. 2 as seen along viewing lines II—II.

Referring now to FIGS. 2–4, it can be seen how the principles of the invention described with reference to FIG. 1 are implemented to provide crosstalk reduction in practice. In these Figures, an electrical connector of the type known as an OMNI RJ45 jack connector, modified in accordance with the aspects of the subject invention, is shown. In the embodiment shown there are eight contacts defining four pairs of contacts in accordance with industry usage.

The connector 30 comprises an insulative housing 32 supporting a plurality of electrical contacts 34 thereon in side-by-side arrangement. Each contact 34 includes a forward terminal portion 34a formed in cantilevered fashion to make electrical connection to complementary contacts in an OMNI plug connector (not shown). Each contact 34 further includes a rearward terminal, preferably in the form of an insulation displacement contact (IDC) for electrical connection with conductors of insulated wire. Between each forward terminal 34a and rearward terminal 34b, each contact includes a transition portion 34c having a generally rectangular cross-section and having a substantially flat surface area between the forward and rearward terminals. The flat transition portions, which are formed to make a pitch transition between the pitch of the IDC rearward terminals 34b and the cantilevered forward terminals 34a are supported on the connector housing 32 in laterally spaced disposition and such that the flat surfaces of the transition portions 34c lie substantially in a common plane.

In accordance with the invention, the signal path of two of the contacts in the connector 30 are re-routed for purposes as will be described hereinbelow to assist in the crosstalk reduction features of the connector. Thus, at the rear portion of the connector, the signal path of contact 3 is placed between contacts 5 and 7, while the signal path 6 is placed between contacts 2 and 4, as illustrated in Figure 2. It can be seen in FIG. 2 that the forward terminal portions 34a are maintained in the proper sequential order of contacts from 1–8.

To accomplish the signal path re-routing, contacts 3 and 6 are severed, defining for contact 3 a forward portion 34d and a discontinuous rearward portion 34e. Similarly, for contact 6, a forward portion 34f is defined discontinuous from a rearward portion 34g.

A printed circuit board (PCB) 36 comprising insulated circuitry is attached to the electrical connector 30, preferably at the bottom thereof. The PCB 36 includes a dielectric substrate 38 supporting thereon a pair of circuit elements 40 and 42. Circuit element 40 includes a conductive trace 40a, a connecting trace 40b and a rerouting trace 40c. Conductive trace 40a lies in spatial registry over contact 7 and forms a capacitive relationship therewith. Connecting trace 40b extends transversely from conductive trace 40a to re-routing trace 40c and bridges the rearward portion 34g of severed contact 6 where it is suitably connected therewith. Re-routing portion 40c has an extent lying in spatial registry with contact 5 over a given length and bridges over contact 4 to contact 3 where it is connected to the forward portion 34d thereof.

Circuit element 42 comprises a conductive trace 42a, a connecting trace 42b and a re-routing trace 42c. Conductive trace 42a lies in spatial registry with contact 2 and defines a capacitive relationship therewith. Connecting trace 42b extends from conductive trace 42a to re-routing trace 42c, transversely therewith, and bridges the rearward portion 34e of contact 3 to which it is connected. Rerouting trace 42c includes an extent lying for a given length in spatial registry with contact 4 and is configured to bridge contact 5 and be connected to the forward portion 34f of contact 6. Circuit elements 40 and 42 thereby re-route the signal paths of contacts 3 and 6 and, as will be indicated hereinbelow, add capacitance to such re-routed signal paths.

Figure 5:
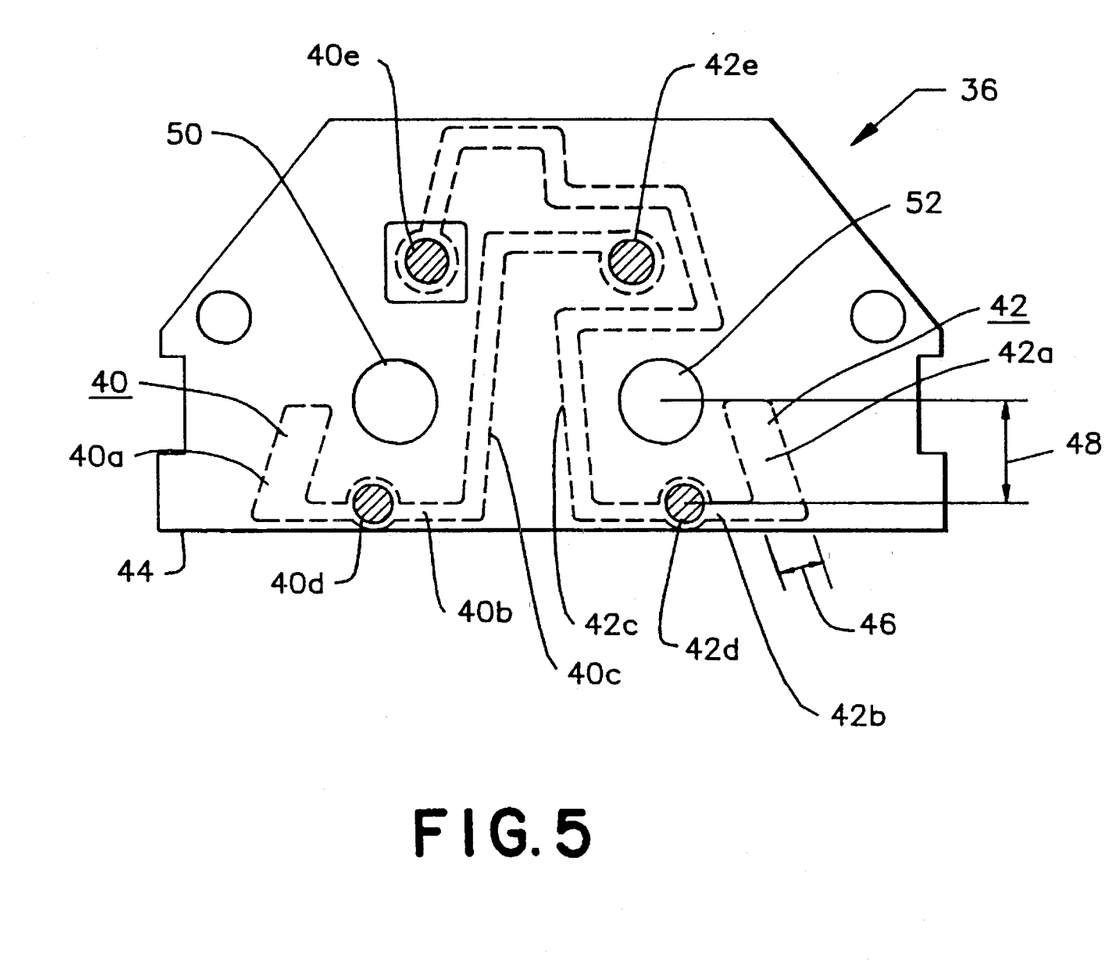
FIG. 5 is a top plan view of the circuit board used in conjunction with the connector of FIG. 2.

Turning now to FIG. 5, the details of the printed circuit board 36 are more fully described. In the arrangement shown, circuit elements 40 and 42 are configured in a manner such that there are no cross-over points between the conductive traces defining each circuit element. As such, the PCB 36 is formed of a pair of layers of dielectric films 44 sandwiching therebetween the circuit elements 40 and 42. In the preferred construction, each conductive film is made of a polyimide material 0.001 inch thick, such material being commercially available under the tradename KAPTON. The circuit elements are preferably defined by conductive traces of copper each having a thickness of approximately 0.004 inch. The circuit width of the connecting traces 40b and 42b as well as the re-routing portions 40c and 42c all typically have a dimension of about 0.018 inches. The connecting traces 40b and 42b at the position where such connecting traces are connected to the respective contacts 6 and 3, each have an enlarged welding pad 40d and 42d. Similarly, at the terminus of each of the re-routing traces 40c and 42c where such traces are respectively connected to the contacts 6 an 3, there are similarly formed enlarged welding pads 40e and 42e. A portion of the dielectric film 44 in alignment with each of the welding pads 40d, 40e and 42d, 42e is removed at both the top and bottom surfaces of the PCB 36 in order to expose such welding pads to allow welding thereof to the respective severed portions of contacts 3 and 6.

Referring still to FIG. 5, conductive traces 40a and 42a are configured to have a length and width to provide with the contacts 7 and 2, respectively, a predetermined capacitance. For example, each conductive trace 40a and 42a may be formed to have a width 46 approximately 0.050 inch and a length of approximately 0.100 inch will provide a capacitance on the order of about 2pF between contact 7 and trace 40. It is understood, however, that other dimensions, depending upon the desired capacitance, may be chosen.

Through holes 50 and 52 which extend completely through the dielectric film 44 are disposed in a manner such that when the PCB is attached to the connector 30, such holes 50, 52 lie in alignment with the severed portions of contacts 6 and 3.

Figure 6:
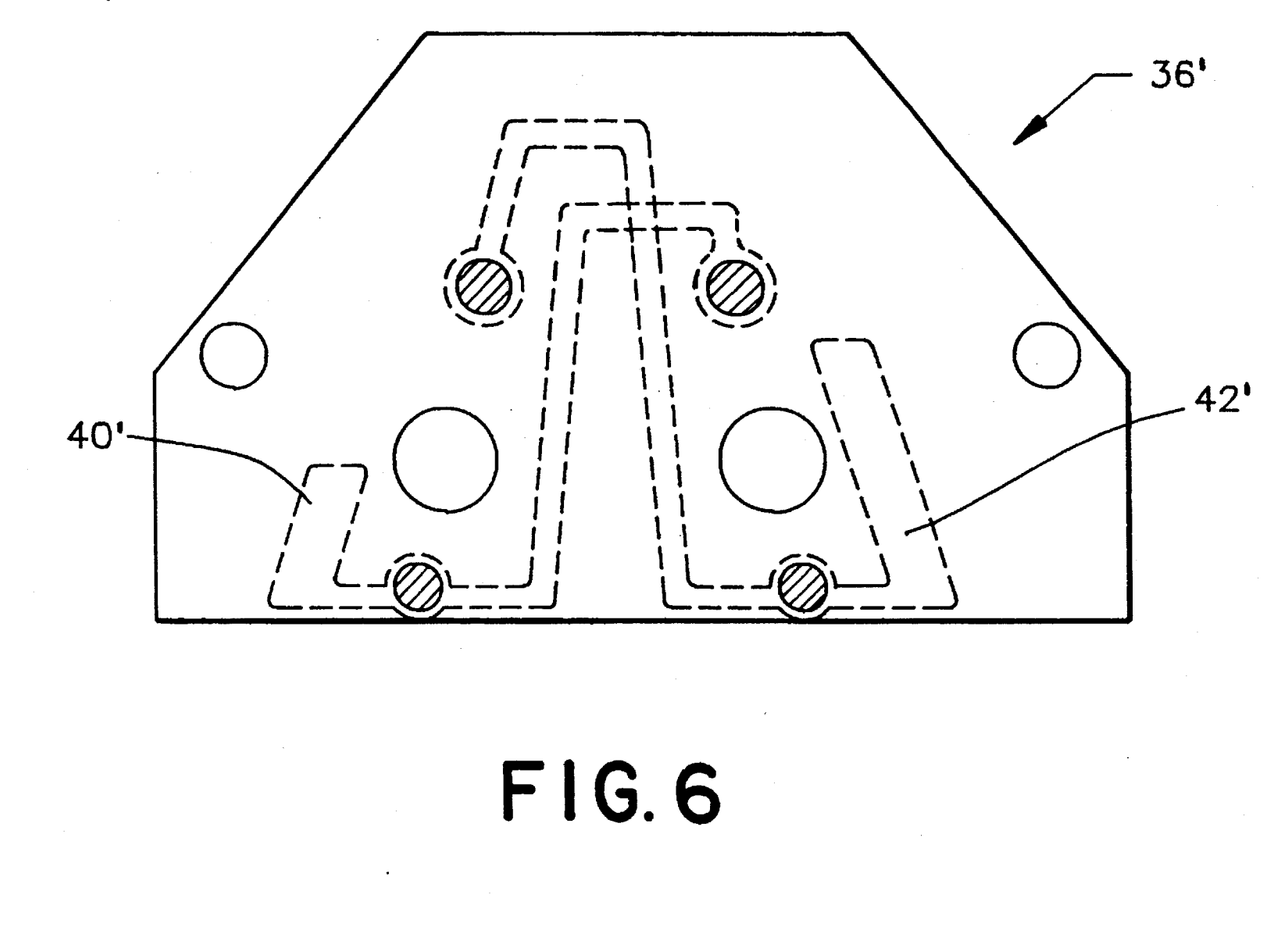
FIG. 6 is an alternate embodiment of a printed circuit board for use in conjunction with the connector of FIG. 2.
Figure 7:
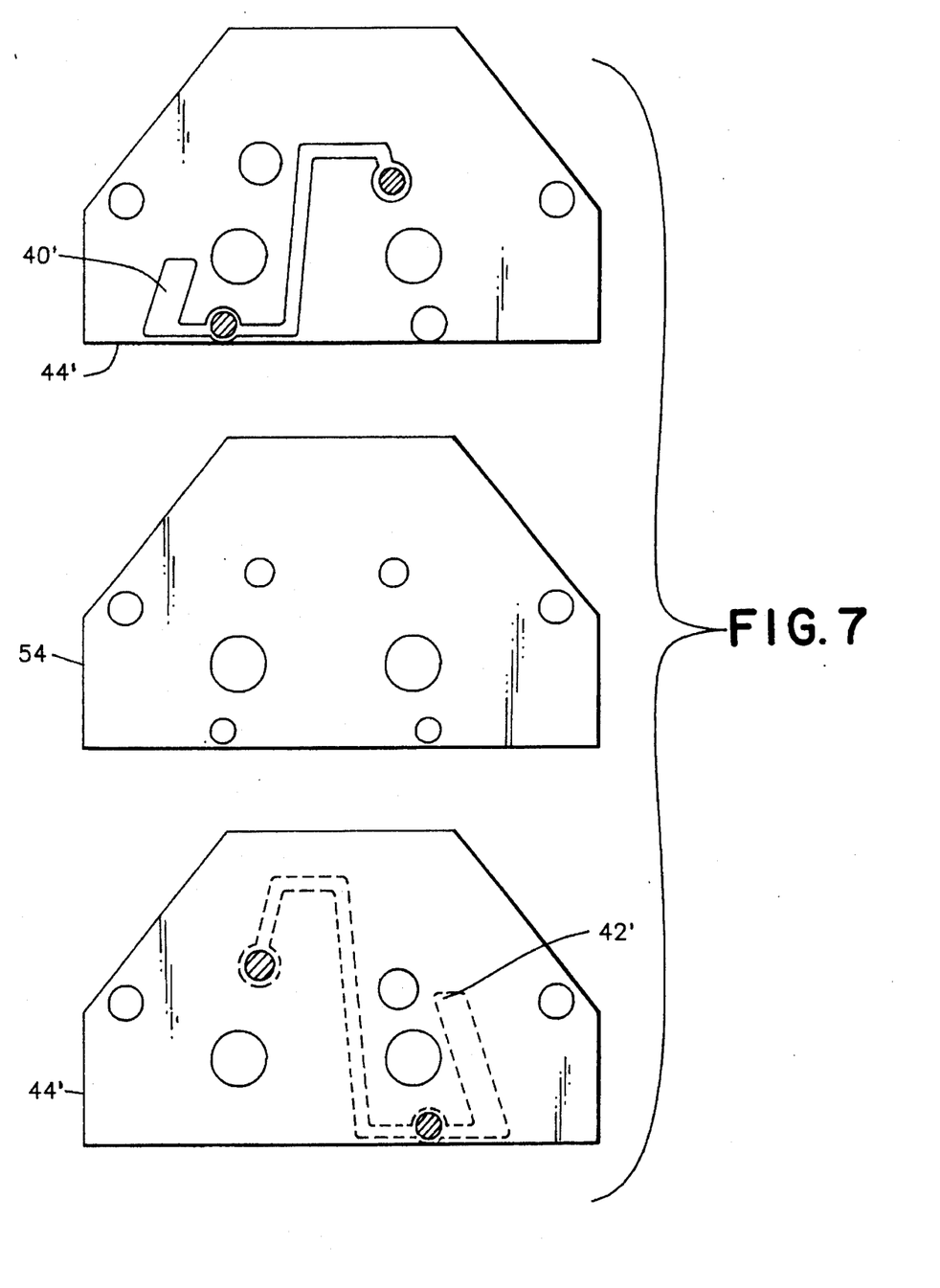
FIG. 7 is an exploded view of the components of the alternate printed circuit board of FIG. 6.

Referring now to FIG. 6 and 7, an alternate construction of the printed circuit board 36' is described. In this arrangement, the circuit elements 40' and 42' are configured in a manner such that there is a mutual overlapping of portions of the conductive traces. In order to construct such a printed circuit board 36' circuit element 40' is formed on a first dielectric film 44' while the other circuit element 42' is formed on a second dielectric film 44'. Prior to sandwiching the circuit elements 40' and 42' together to form the assembled PCB 36', a middle layer 54 of suitable insulation, such as a KAPTON film on the order of 0.001 inch thick must be inserted to insulate the respective circuit elements. Thus, the construction of a PCB 36' wherein the circuit pattern is arranged to mutually cross-over, is somewhat thicker and slightly more expensive to manufacture than the PCB 36 of FIG. 5, wherein both circuit elements 40 and 42 may be formed on one film which may then be covered with a second film.

Figure 8A:
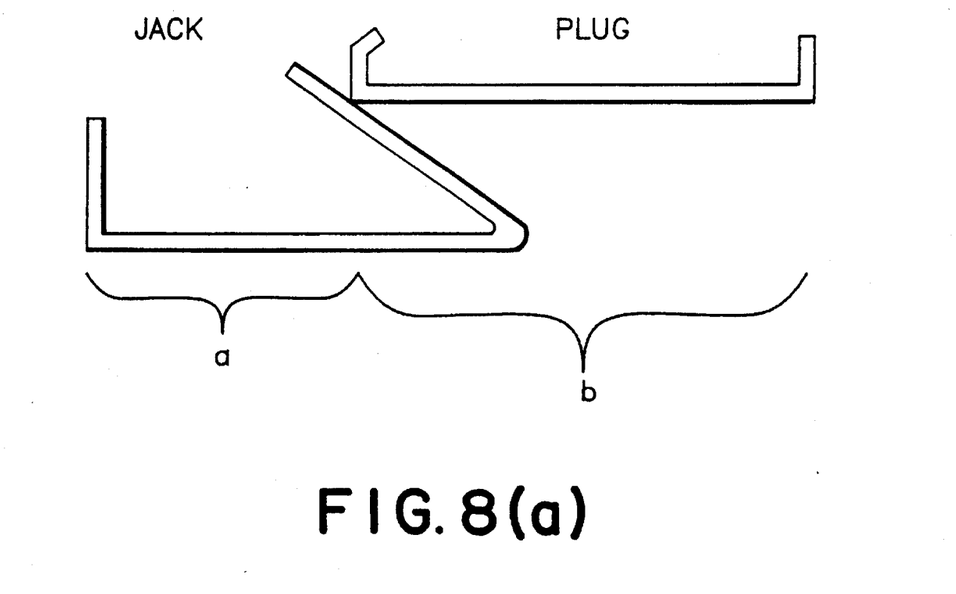
FIGS. 8a and 8b are schematic illustrations of contacts of the improved OMNI jack of the subject invention shown in connection with a standard OMNI plug.
Figure 8B:
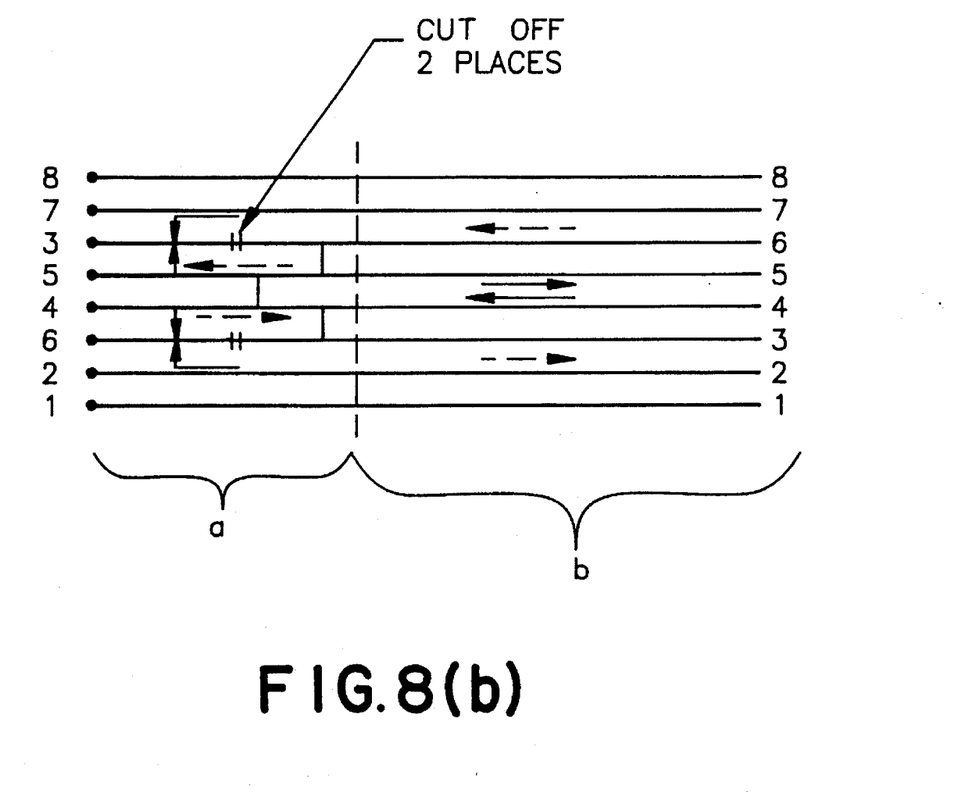

Referring now to FIG. 8, there is a schematic representation of the contacts of the modified OMNI jack as constructed herein and an OMNI plug which is of standard conventional construction. The OMNI jack and OMNI plug typically make a relatively long and close parallel multi-conductor circuit. Particularly, pair 1 (contacts 4 and 5) and pair 3 (contacts 3 and 6) typically define the worst condition for crosstalk problems.

To reduce the crosstalk, the area "a" defined by the wide conductor area of the OMNI jack is modified in a manner as described herein by the addition of a PCB 36 having the insulative circuitry thereon. The two circuit elements as indicated hereinabove are suitably welded to the severed contacts 3 and 6. The conductive trace 40a of the first circuit element 40 has a capacitive relationship to contact 7. Similarly, the conductive trace 42a of the second circuit element 42 has a capacitive relationship to conductor 2. Welding of the circuit elements 40 and 42 to the severed contacts 3 and 6, not only re-routes the signal paths thereof, but adds to such signal paths, the capacitances produced by the conductive traces 40a and 42a.

Further, the circuit "b" of the OMNI plug is much longer than the circuit "a" of the OMNI jack and the electromagnetic force (EMF) is thereby larger. To counter this effect, the signal paths in area "a", as described hereinabove of contacts 3 and 6, were re-routed by the circuit elements 40 and 42 on PCB 36 Since in area "a", contacts 3 and 5 are quite close, and contacts 4 and 6 are similarly quite close, the induced EMF per unit length is much higher than the counterpart EMF in area "b". Thus, in the shorter paths in area "a" it is believed that a sufficient amount of induced EMF is generated to counter the induced EMF of area "b". In current commercial OMNI connectors without the subject improvement therein, the crosstalk between pair 1 and pair 3 typically measure between 26.4dB to 26.7dB at 100 MNz. Pair 1 is defined by contacts 4 and 5 while pair 3 is defined by contacts 3 and 6. Crosstalk between pair 1 and pair 3 is normally very high and the dominant factor is mutual inductance. By providing the two circuit elements 40 and 42, the mutual inductance is balanced and crosstalk reduction is achieved between pair 1 and pair 3. An OMNI connector modified in accordance with the re-routed signal paths and selected capacitance was found to have a measured crosstalk in one direction of approximately 43.0dB and 42.2dB in the reverse direction, at 100 MHz. Thus, while and OMNI jack connector may be modified as set forth herein to provide desired crosstalk reduction, a standard, non-modified OMNI plug connector may be used for connection therewith.

Having described herein the preferred embodiments of the subject invention, it should be appreciated that variations may be made thereof without departing from the contemplated scope of the invention. Accordingly, the preferred embodiments described herein are intended to be illustrative rather than limiting. The true scope of the invention is set forth in the claims appended hereto.

We claim:

1. An electrical connector comprising:

an insulative housing;

a plurality of elongate electrical contacts supported on said housing, said contacts being disposed in a mutually spaced side-by-side arrangement;

a dielectric substrate overlying said contacts;

a conductive trace supported by said dielectric substrate, said trace having an extent being disposed in spatial registry with a longitudinal portion of one of said contacts and being of configuration to define with said one contact and with the permeability and the dielectric constant of said dielectric substrate a predetermined mutual inductance and capacitance; and a conductive element connecting said conductive trace to another one of said contacts.

2. An electrical connector according to claim 1, wherein said conductive element comprises a further conductive trace portion connected to said conductive trace.

3. An electrical connector according to claim 1, wherein there is another conductive trace on said dielectric substrate, having a portion disposed in spatial registry with another contact of said connector.

4. An electric connector according to claim 3, wherein said contacts are of generally rectangular cross-sections each having a substantially flat surface over which said conductive traces overlie.

5. An electrical connector comprising:

an insulative housing;

a plurality of electrical contacts supported on said housing in a mutually spaced side-by-side arrangement, at least first and second of said contacts being severed, thereby defining discontinuous forward and rearward portions of the first contact and discontinuous forward and rearward portions of the second contact;

insulative circuitry on said housing, including a pair of circuit elements, one of said circuit elements connecting a forward portion of the first contact to a rearward portion of the second contact, and the other of said circuit elements connecting a rearward portion of said first contact to a forward portion of said second contact, thereby re-routing the signal paths of said two electrical contacts.

6. An electrical connector according to claim 5, wherein said insulative circuitry comprises a dielectric substrate overlying said contacts, each pair of circuit elements being supported by said dielectric substrate and being insulated from each other.

7. An electrical connector according to claim 6, wherein contacts other than said first and second contacts are unsevered and wherein each circuit element comprises a conductive trace disposed in spatial registry with a selected one of said non-severed contacts, each said trace being of configuration to define with said selected non-severed contact and the dielectric constant of said dielectric substrate inductance and capacitance.

8. An electrical connector according to claim 7, wherein each circuit element further comprises a connecting trace connected to each said conductive trace, one of said connecting traces being connected to a rearward portion of said severed first contact and the other of said connecting traces being connected to a rearward portion of said severed second contact.

9. An electrical connector according to claim 8, wherein each circuit element further comprises a re-routing trace connected to each said connecting trace, each said re-routing trace having an extent lying for a given length in spatial registry over another one of said non-severed contacts, one of said re-routing traces being connected to a forward portion of said severed first contact and the other of said re-routing traces being connected to a forward portion of said severed second contact.

10. An electrical connector according to claim 9, wherein said conductive traces and said re-routing traces of each circuit element overlie non-severed contacts immediately adjacent to and on opposite sides of said first and second severed contacts with each connecting trace being connected to and bridging said rearward portions of such severed contacts.

11. An electrical connector according to claim 10, wherein said electrical contacts each define a forward terminal and a rearward terminal and a transition portion therebetween, said dielectric substrate overlying said transition portion of said contacts.

12. An electrical connector according to claim 11, wherein said transition portions of said contacts are of generally rectangular cross-section, each having a substantially flat surface over which said dielectric substrate lies.

13. An electrical connector according to claim 10, wherein said dielectric substrate comprises a pair of dielectric films sandwiching said pair of circuit elements.

14. An electrical connector according to claim 10, wherein said re-routing traces spatially and insulatively mutually cross-over each other.

15. An electrical connector according to claim 14, wherein said dielectric substrate comprises a pair of dielectric films sandwiching said pair of circuit elements, a middle layer of insulation disposed between and insulating said pair of circuit elements.

16. A method of reducing crosstalk between electrical contacts in a multicontact electrical connector, comprising the steps of:

re-routing the signal path of one of said contacts to continue along a second one of said contacts; and balancing mutual inductance in said re-routed signal path, wherein said re-routing is effected by severing first and second of said contacts and laying insulated circuit elements thereover, connecting a first portion of said first severed contact with a second portion of said second severed contact, and connecting a second portion of said first severed contact with a first portion of said second severed contact.

17. The method according to claim 16, wherein contacts other than said first and second contacts are unsevered and wherein said mutual inductance is balanced by locating conductive traces over said non-severed contacts inclusive of a conductive trace being placed in spatial registry with one of said non-severed contacts and being of configuration to define with said one non-severed contact a predetermined capacitance and mutual inductance.

* * * * *